(12) United States Patent
Tsukada

(10) Patent No.: US 6,727,111 B2
(45) Date of Patent: Apr. 27, 2004

(54) PROCESS FOR MAKING ELECTRONIC CHIP DEVICE INCORPORATING PLURAL ELEMENTS

(75) Inventor: Torayuki Tsukada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/170,012

(22) Filed: Jun. 11, 2002

(65) Prior Publication Data
US 2003/0005576 A1 Jan. 9, 2003

(30) Foreign Application Priority Data
Jun. 12, 2001 (JP) ........................................ 2001-177206

(51) Int. Cl.7 .......................... H01L 21/00; H01C 17/00
(52) U.S. Cl. ........................ 438/33; 438/113; 438/458; 438/462; 29/610.1; 29/619; 29/829
(58) Field of Search .................. 29/610.1, 619, 29/830, 846; 338/307, 308, 309, 320, 328; 174/52.1

(56) References Cited

U.S. PATENT DOCUMENTS

| 5,334,968 A | * | 8/1994 | Negoro | 338/320 |
| 5,604,328 A | * | 2/1997 | Kubota et al. | 174/52.1 |
| 5,898,563 A | * | 4/1999 | Hanamura | 361/313 |
| 5,982,273 A | * | 11/1999 | Shibata | 338/320 |
| 5,994,996 A | * | 11/1999 | Van Den Broek et al. | 338/308 |
| 6,005,474 A | * | 12/1999 | Takeuchi et al. | 338/320 |
| 6,242,999 B1 | * | 6/2001 | Nakayama et al. | 338/309 |

FOREIGN PATENT DOCUMENTS

| JP | 05021204 A | * | 1/1993 | H01C/7/00 |
| JP | 06045101 A | * | 2/1994 | H01C/7/00 |
| JP | 06084617 A | * | 3/1994 | H01C/17/24 |
| JP | 06-099567 | | 4/1994 | |
| JP | 09050703 A | * | 2/1997 | F21S/1/00 |

* cited by examiner

Primary Examiner—Alonzo Chambliss
(74) Attorney, Agent, or Firm—Merchant & Gould P.C.

(57) ABSTRACT

A multi-element electronic chip device is manufactured which has a plurality of elements such as film resistors 2 or the like on one insulating substrate 1 by carrying out a step of performing primary division of a ceramic material plate A corresponding to a multiplicity of insulating substrates 1 into ceramic bars A' each corresponding to a row of plural insulating substrates 1, a step of forming grooves 6 in lengthwise side faces of each ceramic bar A' before forming side electrodes 5 for both ends of each film resistor 2 or forming grooves 6 after forming side electrodes 5, and a step of performing secondary division of the ceramic bar A' into individual insulating substrates 1. This structure is a low cost solution for preventing the side electrodes 5 for different film resistors 2 from connecting with each other.

16 Claims, 9 Drawing Sheets

PROCESS FOR MAKING ELECTRONIC CHIP DEVICE INCORPORATING PLURAL ELEMENTS

BACKGROUND OF THE INVENTION

1. Field of the Invention

The present invention relates to a process for making an electronic chip device having a plurality of elements on one insulating chip substrate such as a multi-element chip resistor device having two or more film resistors.

2. Description of the Related Art

A conventional multi-element chip resistor device incorporating two or more film resistors has such a structure as shown in FIGS. 1 and 2.

Specifically, an insulating chip substrate 1 made of a ceramic material has an upper surface formed with a plurality (two in the figure) of film resistors 2, terminal electrodes 3 at both ends of each film resistor 2, and a cover coat 4 covering the film resistors 2. On the other hand, side electrodes 5 are formed on both side faces 1a, 1b of the insulating substrate 1 in electrical connection to the terminal electrodes 3. Further, grooves 6 are provided respectively on the side faces 1a, 1b of the insulating substrate 1 at a position between the side electrodes 5 in order to provide a complete electrical separation between the side electrodes 6 (see JP-A-6-99567, for example).

Conventionally, in manufacturing a multi-element chip resistor device having such a structure, a ceramic material plate A is first prepared which corresponds to a multiplicity of insulating substrates 1, as shown in FIG. 3. The ceramic material plate A is provided with a plurality of lengthwise break grooves A1 and a plurality of widthwise brake grooves A2 for division of the ceramic material substrate A into individual insulating substrates 1. In addition, through-holes A3 are formed in the ceramic material plate A at portions arranged on the lengthwise break grooves A1 and corresponding to the grooves 6 of the insulating substrates 1.

Then, as shown in FIG. 4, the region of each insulating substrate 1 on the surface of the ceramic material plate A is formed with a plurality of film resistors 2, terminal electrodes 3 at both ends of the film resistors 2 and a cover coat 4 covering the film resistors 2 by screen-printing a material paste followed by baking.

Then, the ceramic material substrate A is divided along the lengthwise break grooves A1 into a plurality of ceramic bars A' (primary division), as shown in FIG. 5. Thereafter, side electrodes 5 are formed on respective lengthwise side faces of the ceramic bar A' by applying a material paste followed by baking.

Finally, each ceramic bar A' is divided along the widthwise break grooves A2 into individual insulating substrates 1 (secondary division).

The ceramic material plate A is prepared by forming a plurality of through-holes A3 in a green sheet and thereafter baking it at high temperature.

Due to the high temperature baking, the entire ceramic material plate A deforms in a plane in a manner such that the spacing between the break grooves A1, A2 increases or decreases. However, the variations of expansion or contraction in a plane increases due to the presence of the many through-holes A3.

For this reason, conventionally, multiple kinds of screen masks are prepared in advance in anticipation for different degrees of deformation in screen-printing a plurality of film resistors 2, terminal electrodes 3 and cover coats 4 on the insulating substrates 1 of the ceramic material plate A. One of the screen masks is selected depending on the extent of deformation caused at the time of baking at high temperature.

Accordingly, there is a cost increase problem in forming the film resistors, terminal electrodes and cover coats by screen printing.

In addition, when dividing the ceramic material plate A along the lengthwise break grooves A1 into separate ceramic bars A' (primary division) after the baking, each ceramic bar A' may frequently break at the through-holes A3 located at intermediate positions lengthwise of the ceramic bar. This also invites a cost increase problem due to increased occurrence of defective products and hence decrease of yield.

Further, each ceramic bar A' divided (primary division) from the ceramic material plate A has grooves 6 due to the though-holes A3 in the lengthwise side faces. Accordingly, the ceramic bar may also break intermediately at the grooves 6 at the time of forming the side electrodes 5 on the lengthwise side faces.

Furthermore, when applying a material paste to form the side electrodes 5 onto the lengthwise side faces of each ceramic bar A', the material paste flows in the grooves 6 to cause electrical conduction between the adjacent side electrodes 5. In other words, the step of forming the side electrodes 5 is also a cause for defective products and hence a low yield, thus further increasing the manufacturing cost.

DISCLOSURE OF THE INVENTION

It is an object of the present invention to provide a manufacturing process which eliminates these problems.

According to a first aspect of the present invention, a process for making an electronic chip device having a plurality of elements is provided which comprises a step of forming at least two elements, terminal electrodes at both ends of each element and a cover coat covering the elements in an area of each insulating substrate on a surface of a ceramic material plate corresponding to a-multiplicity of insulating substrates each of which provides one electronic component; a step of performing primary division of the ceramic material plate into ceramic bars each corresponding to a row of plural insulating substrates; a step of forming grooves in lengthwise side faces of each ceramic bar between the terminal electrodes; a step of forming side electrodes on the lengthwise side faces of the ceramic bar; and a step of performing secondary division of the ceramic bar into individual insulating substrates.

In this manner, since the ceramic material plate is primarily divided into ceramic bars and grooves thereafter are formed on both lengthwise side faces of each ceramic bar, there is no need to form through-holes in the ceramic material plate for forming grooves on both side faces of each insulating substrate. In other words, the ceramic material plate can be baked without forming a multiplicity of through-holes, making it possible to reduce variations or unevenness of deformation in a plane caused upon baking the ceramic material plate. It is thus possible to reduce the cost required for forming elements such as film resistors, terminal electrodes and cover coats by screen-printing, as compared with the conventional process.

In addition, the ceramic material plate is free of through-holes required in the conventional process for forming grooves. Accordingly, when performing primary division of the ceramic material plate into ceramic bars, it is possible to reduce the likelihood that each ceramic bar breaks at intermediate positions, thereby reducing the number of defective products for improving the yield. Thus, combined with a cost reduction for the above-described screen-printing, the manufacturing cost can be greatly reduced.

According to a second aspect of the invention, a process is provided for making an electronic chip device having a plurality of elements, the process comprising a step of forming at least two elements, terminal electrodes at both ends of each element and a cover coat covering the elements in an area of each insulating substrate on a surface of a ceramic material plate corresponding to a multiplicity of insulating substrates each of which provides one electronic component; a step of performing primary division of the ceramic material plate into ceramic bars each corresponding to a row of plural insulating substrates; a step of forming side electrodes on lengthwise side faces of each ceramic bar; a step of forming grooves in the lengthwise side faces of the ceramic bar between the terminal electrodes; and a step of performing secondary division of the ceramic bar into individual insulating substrates.

In this manner, grooves are formed in each ceramic bar after forming the side electrodes on the ceramic bar. Accordingly, in the step of forming the side electrodes on the ceramic bar, the ceramic bar is less likely to break at intermediate positions. Further, the side electrodes of different film resistors are prevented from electrically conducting with each other via the groove, as opposed to the conventional process. In other words, when forming the side electrodes, it is possible to reduce the number of defective products for improving the yield, thus further reducing the manufacturing cost.

Further, according to a third aspect of the invention, the formation of the grooves in the lengthwise side faces of each ceramic bar is performed with a plurality of ceramic bars laminated one over another, or a plurality of grooves are formed simultaneously with respect to one lengthwise side face of the ceramic bar, or in a manner such that a plurality of grooves are formed simultaneously with respect to both lengthwise side faces of the ceramic bar.

This feature is advantageous in that a plurality of grooves are formed at a time for additionally reducing the manufacturing cost by reducing the time needed for forming the grooves.

In addition, according to a fourth aspect of the invention, the process according to any one of the foregoing aspects of the invention is applicable to the manufacture of a resistor device formed with at least two film resistors on one insulating substrate.

Other objects, features and advantages of the present invention will become apparent from the following description of the embodiments given with reference to the accompanying drawings.

DETAILED DESCRIPTION OF THE PREFERRED EMBODIMENTS

Reference is now made to FIGS. 6 to 17 which illustrate the process of manufacturing a multi-element chip resistor device having a plurality of film resistors on one insulating substrate, according to each of different embodiments of the present invention.

Of these figures, FIGS. 6 to 12 show a first embodiment.

Figure 6:
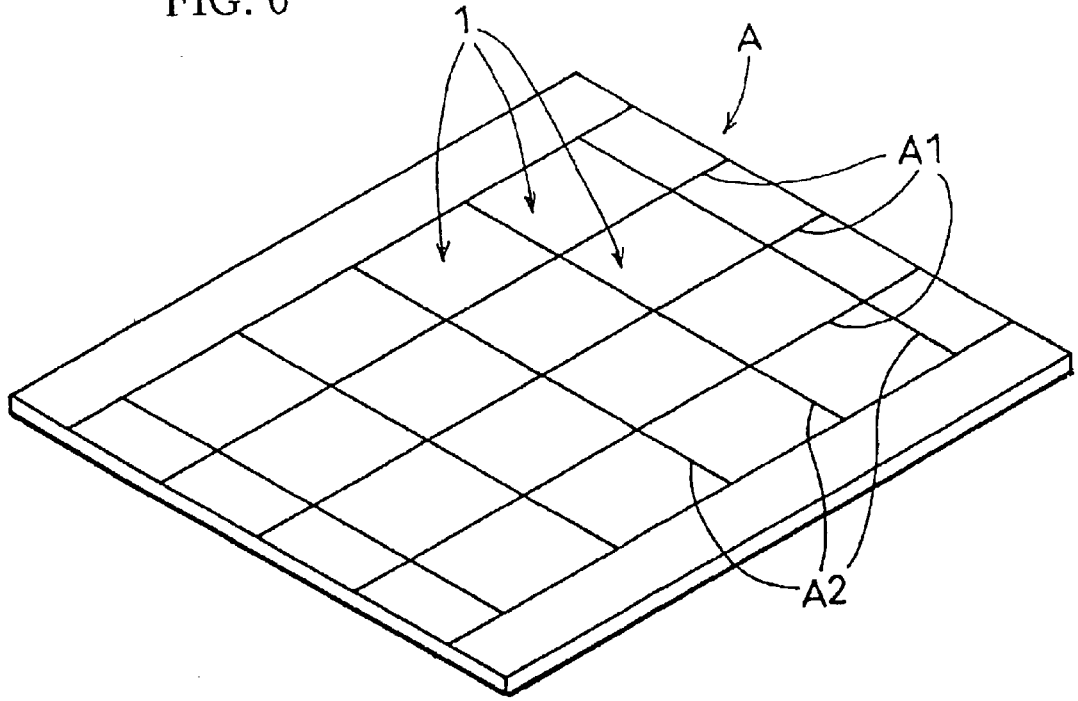
FIG. 6 is a perspective view showing a ceramic material plate to be used in a first embodiment of the present invention.

FIG. 6 of FIGS. 6 to 12 shows a ceramic material plate which corresponds to a multiplicity of insulating chip substrates 1 arranged in a matrix and integrated into one piece.

The ceramic material plate A is inscribed with a plurality of lengthwise break grooves A1 and a plurality of widthwise break grooves A2 in order to divide the ceramic material plate A into individual insulating substrates 1.

Figure 7:
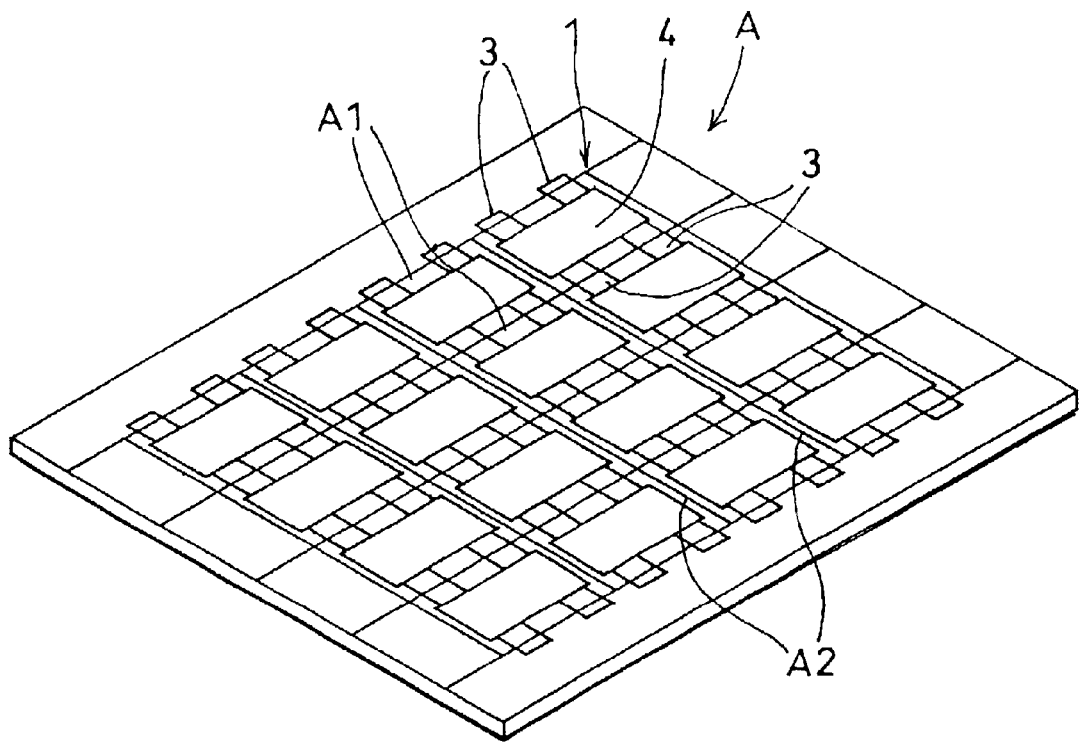
FIG. 7 is a perspective view showing the ceramic material plate on which film resistors and the like are formed in accordance with the first embodiment of the invention.

The region of each insulating substrate 1 on a surface of the ceramic material plate A is formed with a plurality of film resistors 2, terminal electrodes 3 for both ends of the film resistor 2 and a cover coat 4 covering the film resistors 2, by screen-printing a material paste followed by baking, as shown in FIG. 7.

Figure 8:
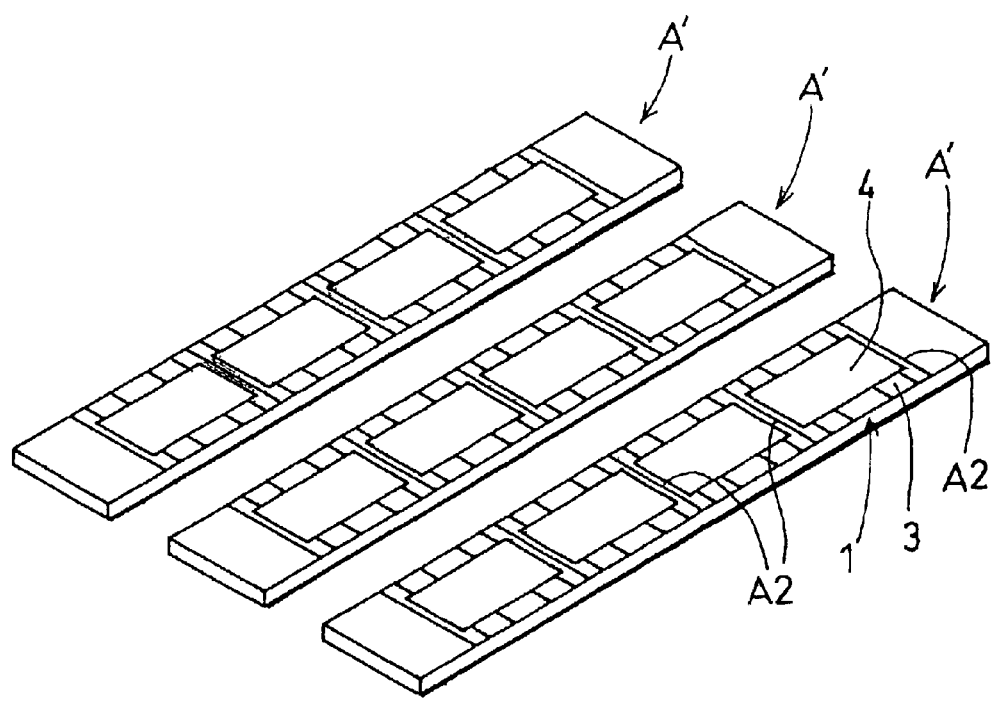
FIG. 8 is a perspective view showing the ceramic material plate as divided into ceramic bars in accordance with the first embodiment.

Then, the ceramic material plate A is divided at the lengthwise break grooves A1 into a plurality of ceramic bars A' (primary division), as shown in FIG. 8.

Figure 9:
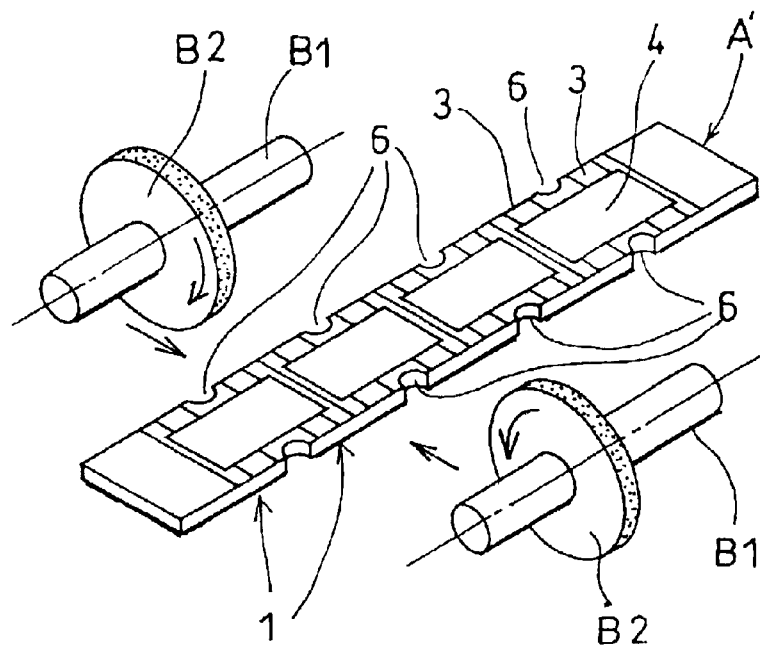
FIG. 9 is a perspective view showing a process step of forming grooves in each ceramic bar in accordance with the first embodiment.

Each ceramic bar A' has opposite lengthwise side faces each of which is pressed against a dicing cutter B2 on a rotary shaft B1 at positions between the terminal electrodes 3 of the insulating substrates 1, as shown in FIG. 9. As a result, grooves 6 are formed due to the cutting or grinding provided by the dicing cutter B2.

Figure 10:
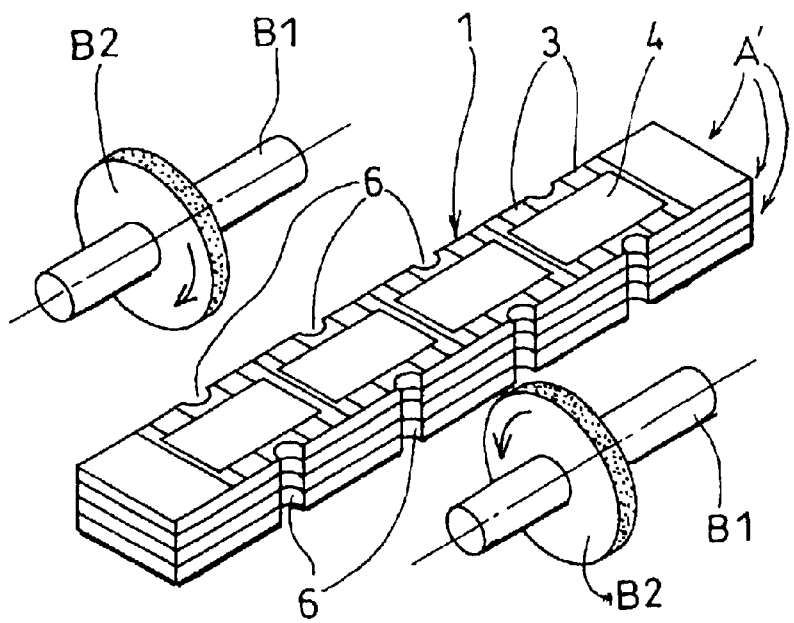
FIG. 10 is a perspective view showing another process step of forming grooves in each ceramic bar in accordance with the first embodiment.

For forming the grooves 6 by the rotary dicing cutter B2, the grooves 6 may be simultaneously formed on a plurality of ceramic bars A' by laminating the plurality of ceramic bars A', as shown in FIG. 10.

Figure 11:
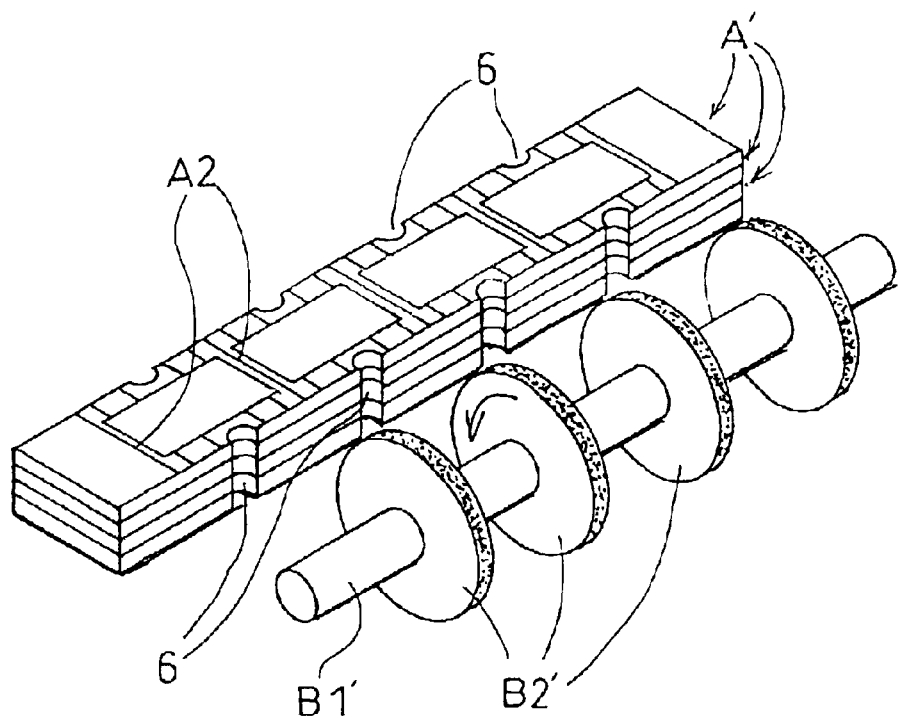
FIG. 11 is a perspective view showing a further process step of forming grooves in each ceramic bar in accordance with the first embodiment.

Alternatively, as shown in FIG. 11, a plurality of dicing cutters B2' may be fixed on a rotary shaft B1'. The dicing cutters B2' are urged against one ceramic bar A' or a laminate of ceramic bars A at one lengthwise side thereof, thereby simultaneously forming a plurality of grooves 6.

In place of cutting with the dicing cutter B2, the grooves 6 may be formed by laser irradiation.

Figure 1:
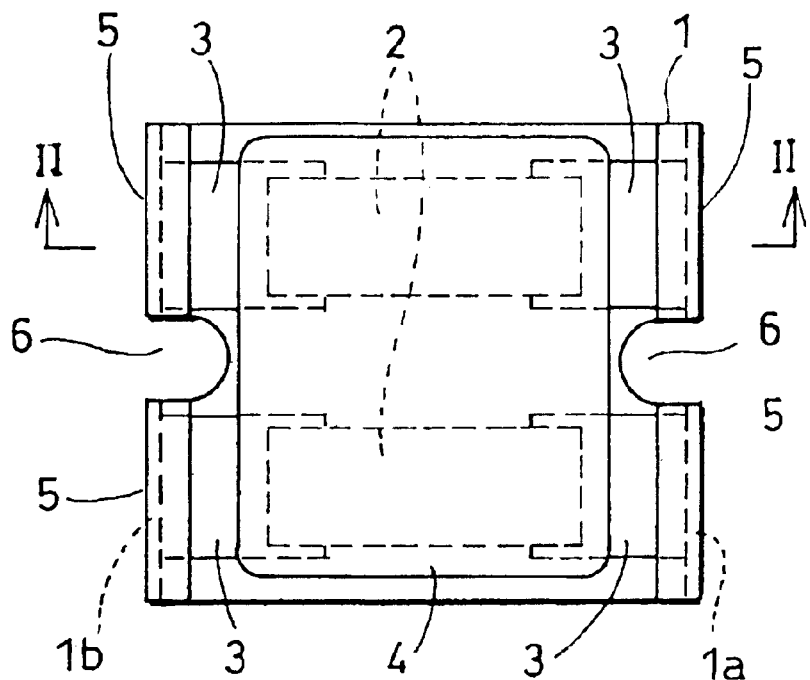
FIG. 1 is a plan view showing a multi-element chip resistor device.
Figure 2:
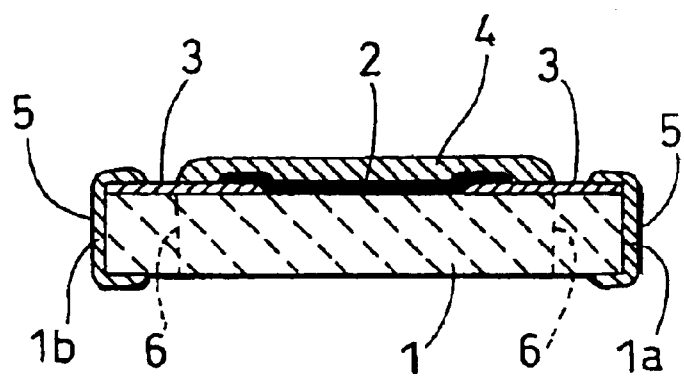
FIG. 2 is a sectional view taken on lines II—II in FIG. 1.
Figure 3:
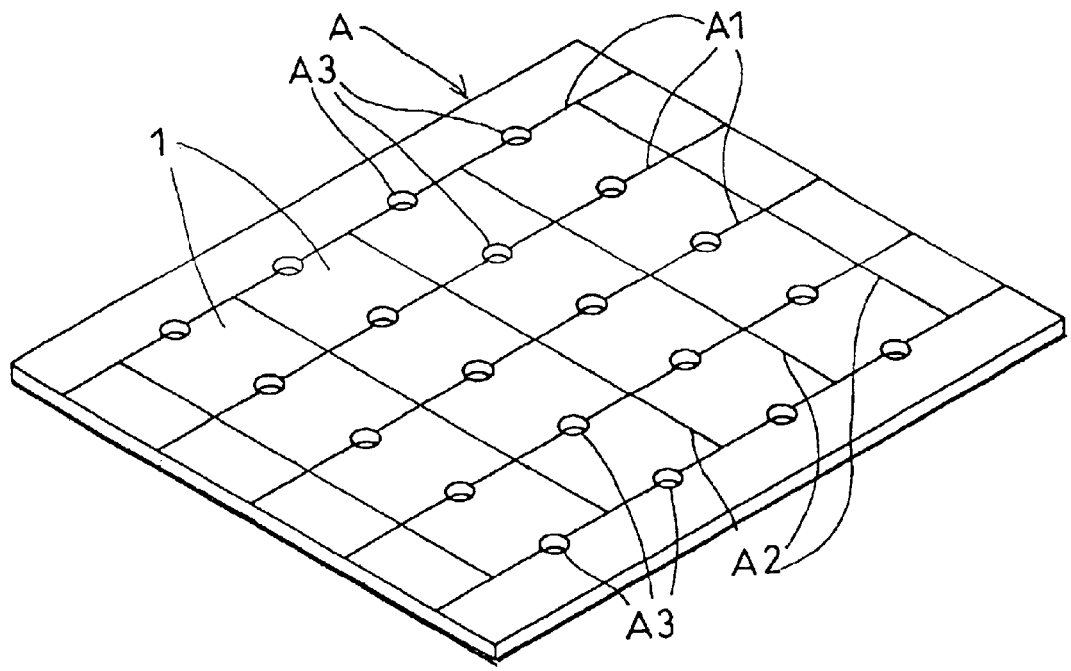
FIG. 3 is a perspective view showing a ceramic material plate to be used in a conventional manufacturing process.
Figure 4:
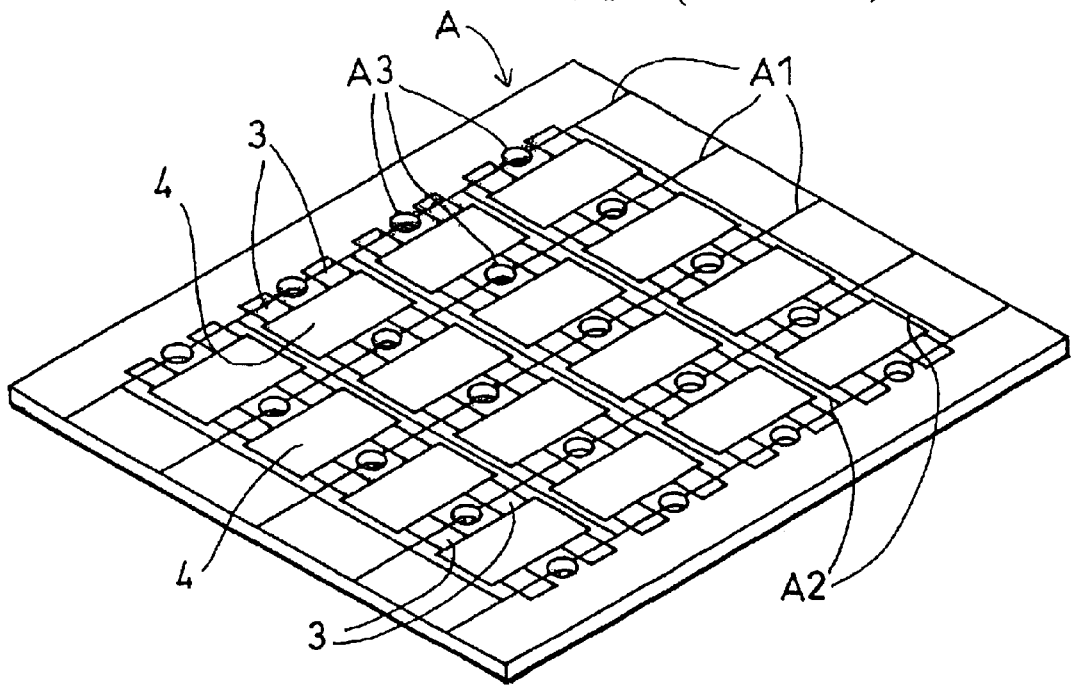
FIG. 4 is a perspective view showing the ceramic material plate on which film resistors and the like are formed in accordance with the conventional manufacturing process.
Figure 5:
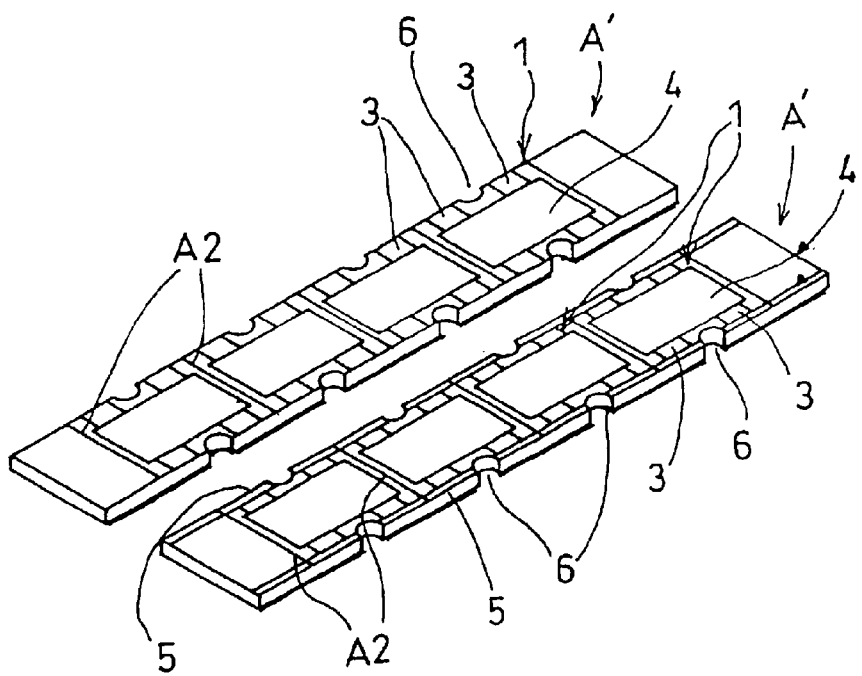
FIG. 5 is a perspective view showing the ceramic material plate as divided into ceramic bars in accordance with the conventional manufacturing process.
Figure 12:
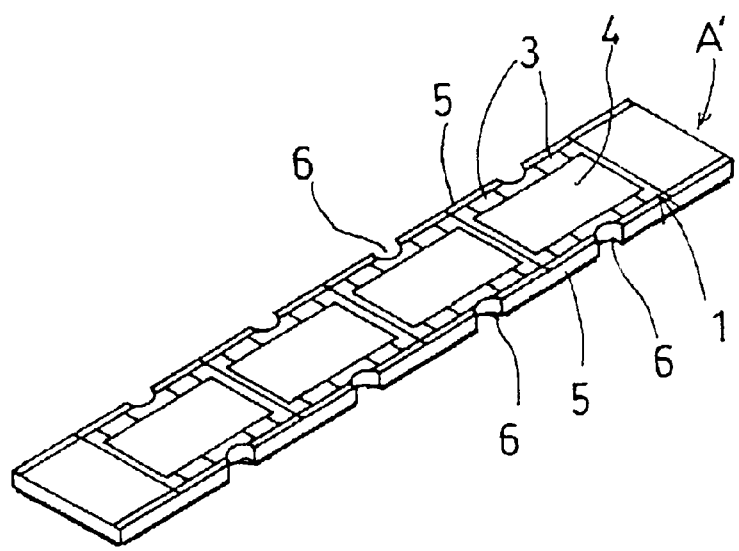
FIG. 12 is a perspective view showing a process step of forming side electrodes on the ceramic bar in accordance with the first embodiment.

After forming the grooves 6 in each insulating substrate 1 of the ceramic bar A' in this manner, side electrodes 5 are formed by applying a material paste onto the opposite lengthwise side faces of the ceramic bar A' followed by baking, as shown in FIG. 12. The ceramic bar A' is divided at the widthwise break grooves A2 into individual insulating substrates 1 (secondary division), thereby manufacturing a multi-element chip resistor device as shown in FIGS. 1 and 2.

In this manner, according to the invention, the ceramic material plate A is divided into separate ceramic bars A' (primary division), and grooves 6 are thereafter formed in opposite lengthwise side faces of each ceramic bar A'. Accordingly, there is no need to form through-holes in the ceramic material plate A, as opposed to the conventional process. As a result, it is possible to reliably reduce variations of deformation in a plane caused upon baking a green sheet. Further, when breaking the ceramic material plate A along the lengthwise break lines A1 into individual ceramic bars A' (primary division), it is possible to reliably prevent the ceramic bar A' from breaking at intermediate positions.

Figure 13:
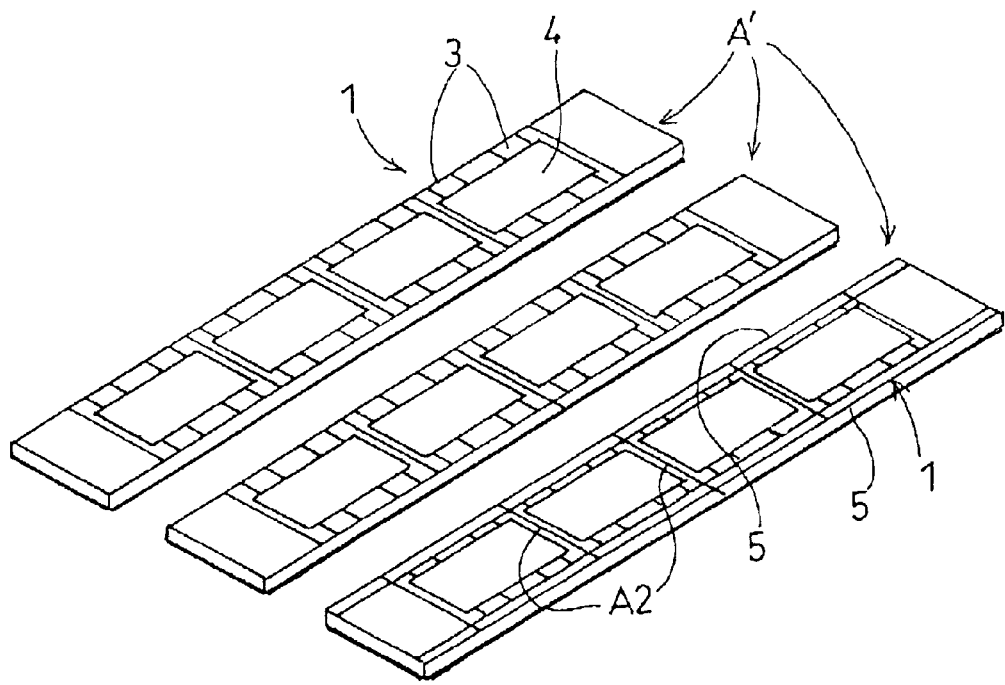
FIG. 13 is a perspective view showing a process step of forming side electrodes each ceramic bar in accordance with a second embodiment of the invention.
Figure 14:
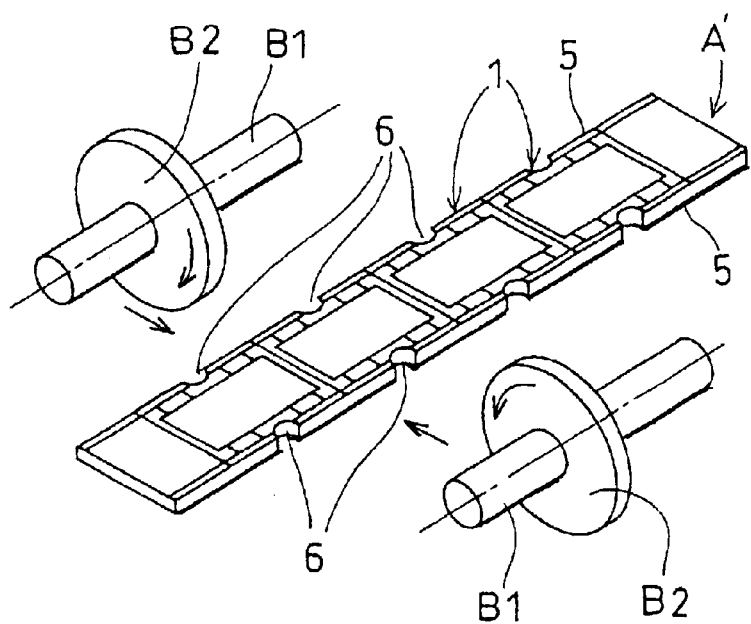
FIG. 14 is a perspective view showing a process step of forming grooves in the ceramic bar in accordance with the second embodiment.

FIGS. 13 and 14 show a second embodiment.

The second embodiment is similar to the first embodiment up to the process steps of dividing a ceramic material plate A along the lengthwise break lines A1 into ceramic bars A'.

After dividing the ceramic material plate A into individual ceramic bars A' (primary division) in this manner, side electrodes 5 are formed on both lengthwise side faces of each ceramic bar A' by applying a material paste followed by baking, as shown in FIG. 13.

Then, as shown in FIG. 14, a dicing cutter B2 fixed on a rotary shaft B1 is pressed against each lengthwise side face of the ceramic bar A' at positions between the terminal electrodes 3 in each insulating substrate 1, thereby forming grooves 6.

The formation of the grooves 6 may, of course, be performed in the same manner as shown in FIG. 10 or 11.

After forming the grooves 6, the ceramic bar A' is divided along the widthwise break grooves A2 into individual insulating substrates 1 (secondary division), thereby manufacturing a multi-element chip resistor device shown in FIGS. 1 and 2.

According to the second embodiment, because the grooves 6 are formed after forming the side electrodes 5 on each ceramic bar A', it is possible to prevent the ceramic bar A' from breaking at intermediate portion and to avoid shorting between the side electrodes 5 through the grooves 6 at the time of forming the side electrodes 5 on the ceramic bar A' while also enjoying the same advantages as the first embodiment.

In each of the foregoing embodiments, the ceramic material plate A is provided with a plurality of lengthwise break grooves A1 and a plurality of widthwise break grooves A2 for division (primary division) of the material plate along the lengthwise break grooves A1 into individual ceramic bars A' and for division (secondary division) of each ceramic bar A' along the widthwise break grooves A2 into individual insulating substrates 1. However, the invention is not limited to division along the break grooves A1 (primary division) and along the break grooves A2 (secondary division), but may perform the primary and secondary division in the following manner.

Figure 15:
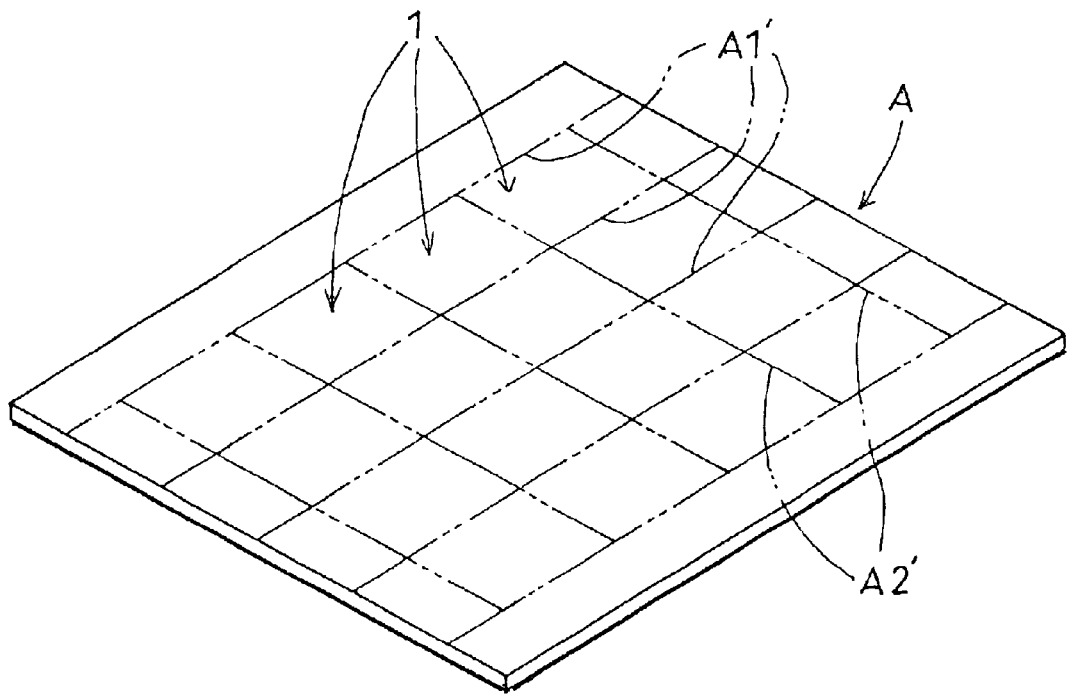
FIG. 15 is a perspective view showing a ceramic material plate to be used in a third embodiment of the invention.
Figure 16:
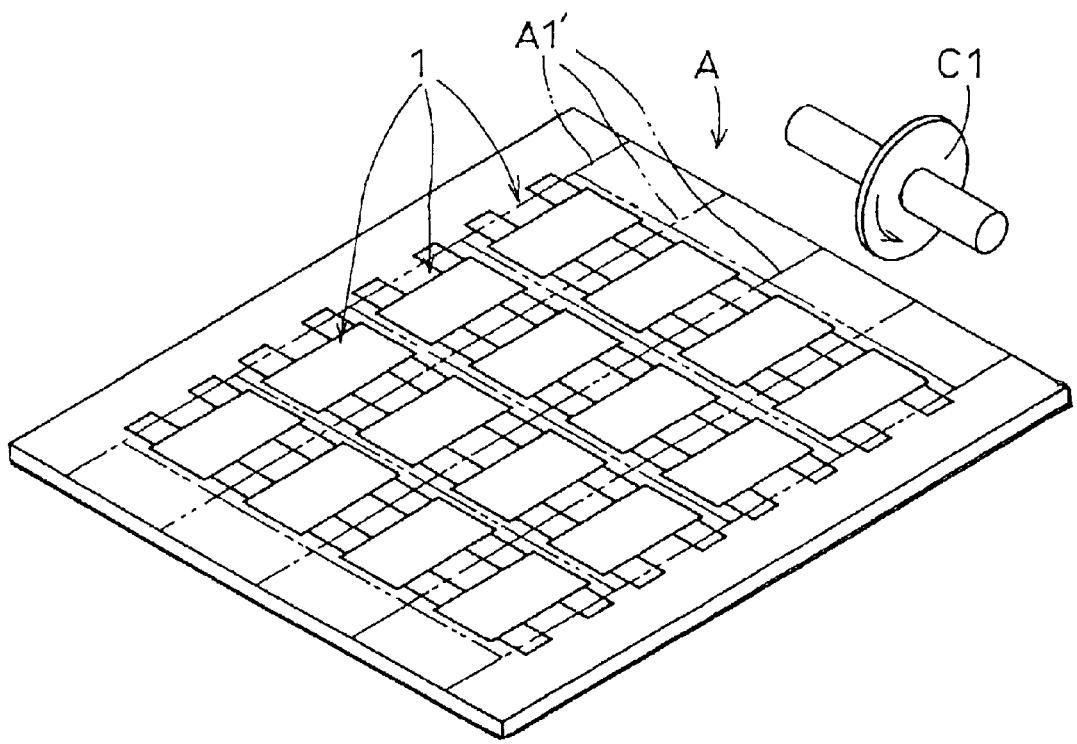
FIG. 16 is a perspective view showing a process step of dividing the ceramic material plate into ceramic bars in accordance with the third embodiment.
Figure 17:
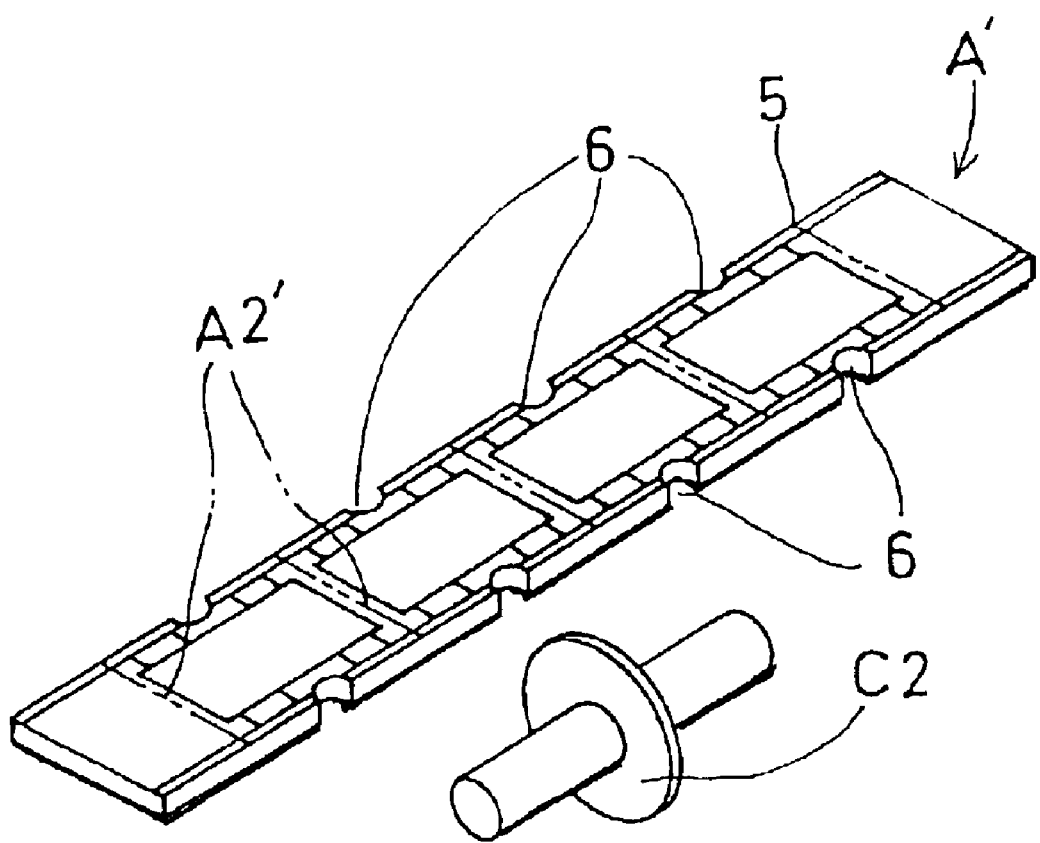
FIG. 17 is a perspective view showing a process step of dividing the ceramic bar into insulating substrates in accordance with the third embodiment.

FIGS. 15, 16 and 17 show such an embodiment. A ceramic material plate A is not provided with lengthwise break grooves A1 nor widthwise break grooves A2. Note that, in these figures, references A1' and A2' merely represent boundary lines between insulating substrates 1 but not break grooves.

After forming film resistors 2, terminal electrodes 3 and a cover coat 4 on a surface of the ceramic substrate A in the region of each insulating substrate 1 in the same manner as described above, the material plate is cut along the boundary lines A1' by a dicing cutter C1 for performing primary division to individual ceramic bars A', as shown in FIG. 16.

Then, similarly to the first embodiment, after forming grooves 6 on both lengthwise side faces of each ceramic bar A', side electrodes 5 are formed. Otherwise, similarly to the second embodiment, after forming side electrodes 5 on the respective lengthwise side faces of each ceramic bar A', grooves 6 are formed.

Then, as shown in FIG. 17, each ceramic bar A' is cut along the boundary lines A2' by a rotary dicing cutter C2 for secondary division into individual insulating substrates 1.

According to this process, since there is no need to provide break grooves on the ceramic material plate A, it is possible to further reduce variations of deformation in a plane caused upon baking a green sheet into the ceramic material plate A.

Incidentally, the primary division with the dicing cutter C1 may be applied to the first or second embodiment for obviating the need for forming lengthwise brake grooves A1 on the ceramic material plate A. This also reduces variations of deformation in a plane caused upon baking a green sheet into the ceramic material plate A.

For the primary and secondary division, lengthwise break grooves A1 and widthwise brake grooves A2 may be formed by laser irradiation after baking a green sheet into a ceramic material plate A. This also reduces variations of deformation in a plane caused upon baking a green sheet into a ceramic material plate A.

Further, though any of the foregoing embodiments is limited to a multi-element chip resistor device having two film resistors on one insulating chip substrate 1, the present invention is not limited to that but may be applied to a chip resistor device having three or more film resistors. The present invention is also applicable to other electronic chip device having a plurality of elements, such as a multi-element chip capacitor having two or more capacitors on one insulating chip substrate.

What is claimed is:

1. A process for making an electronic chip device having a plurality of elements comprising:

a step of forming at least two elements, terminal electrodes at both ends of each element and a cover coat covering the elements on a surface of a non-perforated ceramic material plate corresponding to a multiplicity of insulating substrates each of which provides one electronic component;

a step of performing primary division of the ceramic material plate into ceramic bars each corresponding to a row of plural insulating substrates;

a step of forming grooves in lengthwise side faces of each ceramic bar between the terminal electrodes;

a step of forming side electrodes on the lengthwise side faces of the ceramic bar; and a step of performing secondary division of the ceramic bar into individual insulating substrates.

2. A process for making an electronic chip device having a plurality of elements according to claim 1, wherein the formation of the grooves in the lengthwise side faces of each ceramic bar is performed with a plurality of ceramic bars laminated on each other.

3. A process for making an electronic chip device having a plurality of elements according to claim 2, wherein the electronic component is a resistor device formed with at least two film resistors on one insulating substrate.

4. A process for making an electronic chip device having a plurality of elements according to claim 1, wherein the formation of the grooves in the lengthwise side faces of each ceramic bar is performed in a manner such that a plurality of grooves are formed simultaneously with respect to one lengthwise side face of the ceramic bar.

5. A process for making an electronic chip device having a plurality of elements according to claim 4, wherein the electronic component is a resistor device formed with at least two film resistors on one insulating substrate.

6. A process for making an electronic chip device having a plurality of elements according to claim 1, wherein the formation of the grooves in the lengthwise side faces of each ceramic bar is performed in a manner such that a plurality of grooves are formed simultaneously with respect to both lengthwise side faces of the ceramic bar.

7. A process for making an electronic chip device having a plurality of elements according to claim 6, wherein the electronic component is a resistor device formed with at least two film resistors on one insulating substrate.

8. A process for making an electronic chip device having a plurality of elements according to claim 1, wherein the electronic component is a resistor device formed with at least two film resistors on one insulating substrate.

9. A process for making an electronic chip device having a plurality of elements comprising:

a step of forming at least two elements, terminal electrodes at both ends of each element and a cover coat covering the elements on a surface of a non-perforated ceramic material plate corresponding to a multiplicity of insulating substrates each of which provides one electronic component;

a step of performing primary division of the ceramic material plate into ceramic bars each corresponding to a row of plural insulating substrates;

a step of forming side electrodes on lengthwise side faces of each ceramic bar;

a step of forming grooves in the lengthwise side faces of the ceramic bar between the terminal electrodes; and a step of performing secondary division of the ceramic bar into individual insulating substrates.

10. A process for making an electronic chip device having a plurality of elements according to claim 9, wherein the formation of the grooves in the lengthwise side faces of each ceramic bar is performed with a plurality of ceramic bars laminated on each other.

11. A process for making an electronic chip device having a plurality of elements according to claim 10, wherein the electronic component is a resistor device formed with at least two film resistors on one insulating substrate.

12. A process for making an electronic chip device having a plurality of elements according to claim 9, wherein the formation of the grooves in the lengthwise side faces of each ceramic bar is performed in a manner such that a plurality of grooves are formed simultaneously with respect to one lengthwise side face of the ceramic bar.

13. A process for making an electronic chip device having a plurality of elements according to claim 12, wherein the electronic component is a resistor device formed with at least two film resistors on one insulating substrate.

14. A process for making an electronic chip device having a plurality of elements according to claim 9, wherein the formation of the grooves in the lengthwise side faces of each ceramic bar is performed in a manner such that a plurality of grooves are formed simultaneously with respect to both lengthwise side faces of the ceramic bar.

15. A process for making an electronic chip device having a plurality of elements according to claim 14, wherein the electronic component is a resistor device formed with at least two film resistors on one insulating substrate.

16. A process for making an electronic chip device having a plurality of elements according to claim 9, wherein the electronic component is a resistor device formed with at least two film resistors on one insulating substrate.

* * * * *